(12) United States Patent
Zhang et al.

(10) Patent No.: US 10,847,690 B2
(45) Date of Patent: Nov. 24, 2020

(54) LED PACKAGE STRUCTURE WITH PHOSPHOR ENCAPSULANT LAYER

(71) Applicant: KAISTAR Lighting(Xiamen) Co., Ltd., Xiamen (CN)

(72) Inventors: Shao-Feng Zhang, Xiamen (CN); Liang-Bin Jiang, Xiamen (CN)

(73) Assignee: KAISTAR LIGHTING(XIAMEN) CO., LTD., Xiamen (CN)

( * ) Notice: Subject to any disclaimer, the term of this patent is extended or adjusted under 35 U.S.C. 154(b) by 0 days.

(21) Appl. No.: 16/449,558

(22) Filed: Jun. 24, 2019

(65) Prior Publication Data

US 2019/0312185 A1     Oct. 10, 2019

(30) Foreign Application Priority Data

Aug. 29, 2018   (CN) .......................... 2018 1 0996274

(51) Int. Cl.
*H01L 33/56*     (2010.01)
*H01L 33/50*     (2010.01)

(52) U.S. Cl.
CPC ............ *H01L 33/56* (2013.01); *H01L 33/504* (2013.01)

(58) Field of Classification Search
CPC ............................... H01L 33/56; H01L 33/504
USPC ....................................................... 257/100
See application file for complete search history.

(56) References Cited

U.S. PATENT DOCUMENTS

| 2005/0248271 A1* | 11/2005 | Ng ........................ C09K 11/02 313/512 |
| 2010/0053930 A1* | 3/2010 | Kim ...................... H01L 33/501 362/84 |
| 2016/0161098 A1* | 6/2016 | Tudorica ............... H01L 27/156 315/51 |
| 2016/0254417 A1 | 9/2016 | Morimura et al. |

FOREIGN PATENT DOCUMENTS

CN     106558644 A    4/2017

* cited by examiner

*Primary Examiner* — Tong-Ho Kim
(74) *Attorney, Agent, or Firm* — Li & Cai Intellectual Property (USA) Office

(57) ABSTRACT

An LED package structure with phosphor encapsulant layer includes an LED chip, a first encapsulant layer, and a second encapsulant layer; the first encapsulant layer covers the LED chip mixed with a first type phosphor having an excitation emission peak wavelength in a first wavelength range; the second encapsulant layer covers a first encapsulant layer mixed with a second type phosphor having an excitation emission peak wavelength in a second wavelength range. At least one of the first type phosphor and the second type phosphor is distributed in the corresponding first encapsulant layer or the corresponding second encapsulant layer in a state where the bottom concentration is higher than the top concentration.

12 Claims, 3 Drawing Sheets

LED PACKAGE STRUCTURE WITH PHOSPHOR ENCAPSULANT LAYER

This application claims the benefit of priority to China Patent Application No. 201810996274.9, filed on Aug. 29, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an LED package structure, and more particularly to an LED package structure with a phosphor encapsulant layer.

BACKGROUND OF THE DISCLOSURE

With technological developments relating to light-emitting diodes (LED), applications thereof are also getting more and more diverse. In order to better meet the needs of different applications, the requirements for the light-emitting diodes such as light extraction efficiency, color rendering, and durability are becoming higher and higher.

In order to adjust the wavelength of light emitted by the light-emitting diodes, fluorescent materials are widely used in the LED packaging industry to convert light emitted by chips of various specifications such as blue LED chips or ultraviolet LED chips into white light or lights of various color. In the related art, phosphor materials are mostly mixed with each other in an encapsulant according to the required color coordinates of the final light, and the LED chip is then encapsulated by the encapsulant mixed with the phosphor material. The light emitted by the LED chip can be absorbed by the phosphor material when it passes through the encapsulant and converted into light of different wavelengths and then released.

In practice, the phosphor material is conventionally dispersed in the encapsulant, and the emitted light may be first absorbed by the phosphor material of the first excitation spectrum at the bottom, released after a wavelength conversion, and then subjected to the second excitation spectrum, and the phosphor material is absorbed and then released after wavelength conversion. At this point, the situation is still ideal. However, the two wavelength-converted lights may be absorbed and discharged again and again by the phosphor material in the encapsulant, so that the wavelength conversion occurs repeatedly. The energy of the light is gradually depleted during repeated absorption and release, so that it is difficult to have an ideal light-emitting efficiency.

Therefore, reducing the loss of energy in the process of repeated absorption and release, improving the light extraction efficiency, improving the color rendering index, and increasing the brightness have become important topics in the related art.

SUMMARY OF THE DISCLOSURE

In response to the above-referenced technical inadequacies, the present disclosure provides an LED package structure with phosphor encapsulant layer capable of layering the phosphor mixed with different excitation wavelengths, so as to reduce the loss of energy in the process of repeated absorption and release, thereby improving the light extraction efficiency, increasing the color rendering index, and improving the brightness.

In one aspect, the present disclosure provides an LED package structure with phosphor encapsulant layer. The LED package structure includes an LED chip, a first encapsulant layer, and a second encapsulant layer. The first encapsulant layer covers the LED chip mixed with a first type phosphor, and the first type phosphor is excited to emit a peak wavelength in a first wavelength range. The second encapsulant layer covers the first encapsulant layer mixed with a second type phosphor, and the second type phosphor is excited to emit a peak wavelength in a second wavelength range. The second wavelength range is different from the first wavelength range. At least one of the first type phosphor and the second type phosphor is distributed in the corresponding first encapsulant layer or the second encapsulant layer in a state where the bottom concentration is higher than the top concentration.

Therefore, one of the beneficial effects of the present disclosure is that, the LED package structure with phosphor encapsulant layer provided by the present disclosure has the technical features of "the LED package structure including the first encapsulant layer and the second encapsulant layer" and "at least one of the first type phosphor and the second type phosphor being distributed in the corresponding first encapsulant layer or the second encapsulant layer in a state where the bottom concentration is higher than the top concentration," so as to reduce the loss of energy in the process of repeated absorption and release, thereby improving the light extraction efficiency, increasing the color rendering index, and improving the brightness.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
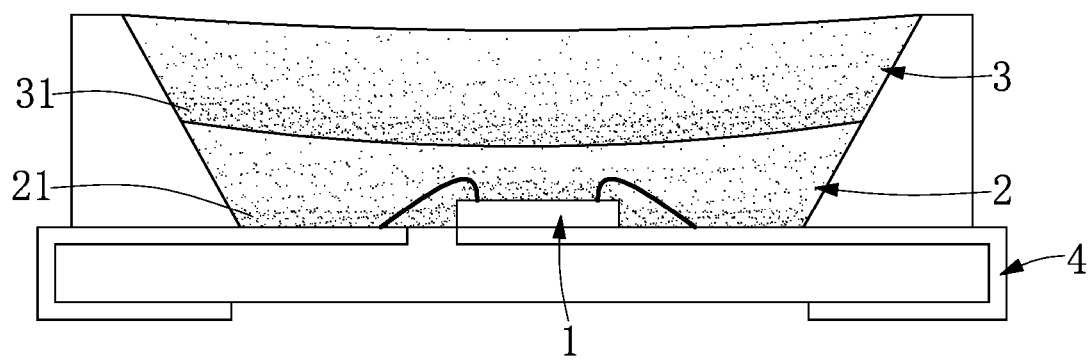
FIG. 1 is a schematic cross-sectional view of an LED package structure with phosphor encapsulant layer according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, FIG. 1 is a schematic cross-sectional view of an LED package structure Z according to a first embodiment of the present disclosure. The first embodiment of the present disclosure provides the LED package structure Z including an LED chip 1, a first encapsulant layer 2, a second encapsulant layer 3, and a conductive layer 4. The LED chip 1 is electrically connected to the conductive layer 4 to obtain electric energy required for emitting light through the conductive layer 4. In this embodiment, the first encapsulant layer 2 covers the LED chip 1 and the conductive layer 4, and the second encapsulant layer 3 covers the first encapsulant layer 2.

The first encapsulant layer 2 is mixed with a first type phosphor 21, and the first type phosphor 21 is excited to emit the peak wavelength in a first wavelength range; the second encapsulant layer 3 is mixed with the second type phosphor 31, and the second type phosphor 31 is excited to have an emission peak wavelength in a second wavelength range. The second wavelength range is different from the first wavelength range. In practical applications, the first wavelength range can be between 600 nm and 660 nm, and the second wavelength range can be between 500 nm and 575 nm; conversely, the first wavelength range can also be between 500 nm and 575 nm, and the second wavelength range can be between 600 nm and 660 nm. In addition, according to the actual required light-emitting effect (for example, according to the needs of the application, different color temperatures can be adopted), the phosphors of other wavelength ranges can be selected, as long as the first wavelength range is different from the second wavelength range to comply with the spirit of the present disclosure.

The first wavelength range between 600 nm and 660 nm is taken as an example; the first type phosphor 21 of the present disclosure may include one or more phosphor materials having emission peak wavelengths in the first wavelength range. For example, a nitride phosphor having a peak wavelength of 625 nm, a nitride phosphor having a peak wavelength of 651 nm, a nitride phosphor having a peak wavelength of 615 nm, or phosphor that includes a nitride or other components having a peak wavelength between 600 nm and 660 nm may be individually selected. Furthermore, two or more of the above-mentioned phosphors may be selected and mixed into the first type phosphor 21 of the present disclosure, and even the two components of the nitride phosphor may be mixed in advance at a predetermined ratio of a nitride phosphor mixture having a peak wavelength of 635 nm to be used as the first type phosphor 21 of the present disclosure. As long as the limitations of the present disclosure is met, one or more types of phosphor materials that are selected, after consideration of the actual product requirements, material sources and cost factors, can be taken as the first type phosphor 21 herein.

The second wavelength range between 500 nm and 575 nm is taken as another example; the second type phosphor 31 of the present disclosure may include one or more phosphor materials having emission peak wavelengths in the second wavelength range. For example, an aluminate phosphor having an emission peak wavelength of 520 nm, an aluminate phosphor having an emission peak wavelength of 530 nm, or an aluminate having an emission peak wavelength between 500 nm and 575 nm may be individually selected depending on the desired color temperature. Two or more of the above-mentioned phosphors may be selected and mixed into the second type phosphor 31 of the present disclosure, and other details thereof are the same as those of the first type phosphor 21, and are thus not repeated herein.

Referring again to FIG. 1, in the embodiment of the present disclosure, the first type phosphor 21 and the second type phosphor 31 are both distributed in the corresponding first encapsulant layer 2 or second encapsulant layer 3 in a state where the bottom concentration is higher than the top concentration. However, it should be noted that, the practical application of the present disclosure is not limited thereto, and only the first type phosphor 21 may be distributed in the first encapsulant layer 2 in a state where the bottom concentration is higher than the top concentration, or only the second type phosphor 31 is distributed in the second encapsulant layer 3 in a state where the bottom concentration is higher than the top concentration, as long as one of the above-mentioned satisfies the condition of "the phosphor being distributed in the encapsulant layer in a state where the bottom concentration is higher than the top concentration".

As can be seen from FIG. 1, in the present embodiment, the concentration of the first type phosphor 21 in the first encapsulant layer 2 decreases from the bottom of the first encapsulant layer 2 to the top of the first encapsulant layer 2; likewise, the concentration of the second type phosphor 31 in the second encapsulant layer 3 also decreases from the bottom of the second encapsulant layer 3 to the top of the second encapsulant layer 3. Since the concentration of the first type phosphor 21 at the top of the first encapsulant layer 2 is relatively low, the top of the first encapsulant layer 2 is connected to the bottom of the second encapsulant layer 3, and the concentration of the second type of phosphor 31 at the bottom of the second encapsulant layer 3 is higher, a phenomenon in which the second type phosphor 31 accumulates on the interface between the first encapsulant layer 2 and the second encapsulant layer 3 is formed. It is worth mentioning that although in the present embodiment, a concave interface is formed between the first encapsulant layer 2 and the second encapsulant layer 3, and the top surface of the second encapsulant layer 3 forms a plane, the present disclosure is not limited thereto. The shape of the interface between the first encapsulant layer 2 and the second encapsulant layer 3, and the shape of the top surface of the second encapsulant layer 3 are not limited to the present disclosure. According to the actual results of the measurements, whether the present disclosure is applied to a product in which the interface between the first encapsulant layer 2 and the second encapsulant layer 3 is a concave, flat or protruding, or in which the top surface of the second encapsulant layer 3 is concave, flat or protruding, desired results can be achieved.

Regarding to the formation of the concentration gradient, the encapsulating colloidal solution containing different concentrations of the phosphor material can be prepared by the slurry method, and the LED surface or the surface of the first encapsulant layer 2 is repeatedly spray coated or dip coated; alternatively, electrophoresis deposition (EPD) may be used to form a phosphor layer of a high packing density at the bottom of the encapsulant layer; or the phosphor material may first be suspended in the encapsulating colloid solution, so that the phosphor material is suspended in the encapsulating colloidal solution, and the phosphor material is formed into a gradient in the encapsulating colloidal solution by natural precipitation or centrifugal precipitation. The present disclosure does not limit the method used to form the concentration gradient.

In the embodiment of the present disclosure, the first type phosphor 21 is distributed in the first encapsulant layer 2 in a state in which the bottom concentration is higher than the top concentration (or the second type phosphor 31 is distributed in the second encapsulant layer 3 in a state where the bottom concentration is higher than the top concentration), therefore, when the light passes through the bottom of the first encapsulant layer 2 (or the second encapsulant layer 3), wavelength conversion can be performed efficiently; in addition, the probability of the light that has a converted wavelength at the bottom of the first encapsulant layer 2 (or the second encapsulant layer 3) being absorbed by the first type phosphor 21 again (or the second type phosphor 31) is lowered during the upward movement from the bottom of the first encapsulant layer 2 (or the second encapsulant layer 3), thus effectively preventing the energy from being gradually depleted during repeated absorption and release. Accordingly, in the present disclosure, the light energy emitted from the LED chip 1 can be efficiently utilized, thereby improving the light extraction efficiency. In addition, since the first type phosphor 21 and the second type phosphor 31 are respectively encapsulated in the first encapsulant layer 2 and the second encapsulant layer 3, and the second encapsulant layer 3 covers the outer side (above) of the first encapsulant layer 2, the light of the wavelength converted by the second type phosphor 31 is not absorbed and converted by the first type phosphor 21 again; therefore, not only can the unnecessary loss of light energy under repeated conversion be further avoided, but also the color rendering index can be effectively improved.

Second Embodiment

Figure 2:
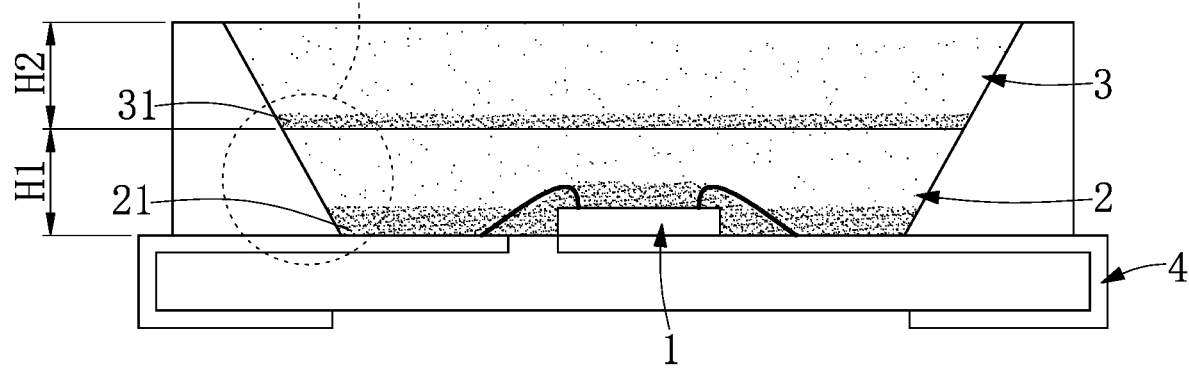
FIG. 2 is a schematic cross-sectional view of an LED package structure with phosphor encapsulant layer according to a second embodiment of the present disclosure.
Figure 3:
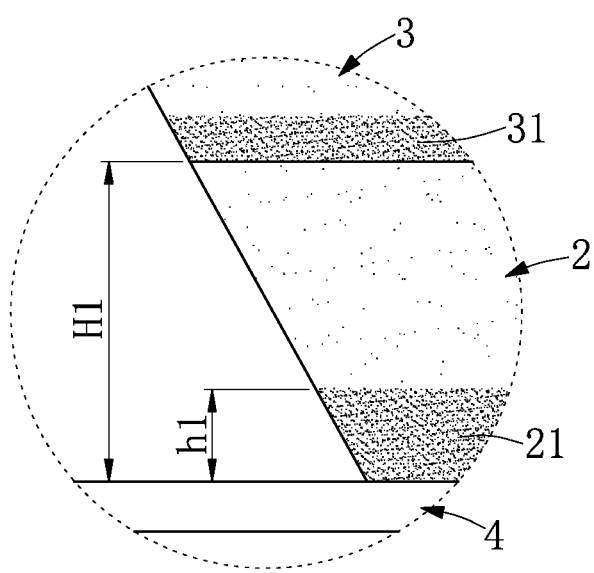
FIG. 3 is an enlarged schematic view of section III of FIG. 2.
Figure 4:
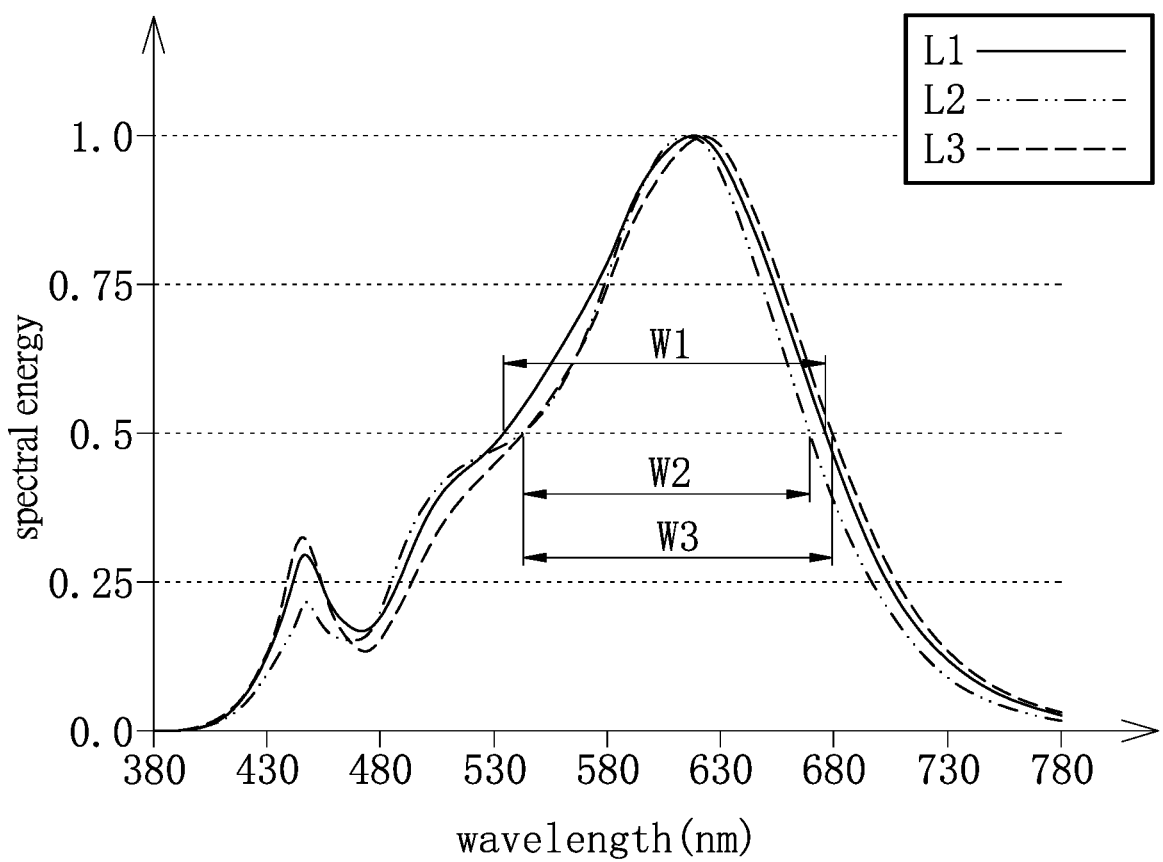
FIG. 4 is a schematic diagram showing a comparison between relative spectral energy distribution curve of two configurations of the second embodiment of the present disclosure and a relative spectral energy distribution curve of the related art.

Referring to FIG. 2 to FIG. 4, FIG. 2 is a cross-sectional view of a LED package structure according to a second embodiment of the present disclosure; FIG. 3 is an enlarged schematic view of a portion III of FIG. 2; FIG. 4 is a schematic diagram showing a comparison between relative spectral energy distribution curves of two aspects of the second embodiment of the present disclosure and a relative spectral energy distribution curve of the related art. As previously stated, whether the present disclosure is applied to a product in which the interface between the first encapsulant layer 2 and the second encapsulant layer 3 is a concave, flat or protruding, or the top surface of the second encapsulant layer 3 is concave, flat or protruding, desired results can be achieved. As can be seen from FIG. 2, the second embodiment of the present disclosure adopts an interface between the first encapsulant layer 2 and the second encapsulant layer 3, and the top surface of the second encapsulant layer 3 is flat.

Compared with the first embodiment of the present disclosure, the first type phosphor 21 and the second type phosphor 31 of the second embodiment of the present disclosure are more concentrated at the bottom of the corresponding first and second encapsulant layers 2, 3. More specifically, referring to FIG. 2 and FIG. 3, in the present embodiment, the first encapsulant layer 2 has a height H1, the second encapsulant layer 3 has a height H2, and most of the first type phosphor 21 and the second type phosphor 31 are concentrated at the bottom of the first encapsulant layer 2 and the second encapsulant layer 3. Take the first encapsulant layer 2 as an example, the overall height is H1, and most of the first type phosphor 21 is concentrated in a range of height h1 on a bottom of the first encapsulant layer 2. In the present embodiment, the range of height h1 is set to $3/10$ of the overall height H1 of the first encapsulant layer 2 (i.e., within a height range of 30% from the bottom of the first encapsulant layer 2), and the first type phosphor 21 in this range accounts for more than 50% of the total amount of the first type phosphor 21. In other words, the amount of the first type phosphor 21 is only less than 50% of the total amount of the first type phosphor 21 beyond the range of height h1. In practical applications, the first type phosphor 21 in the height range of 30% measured upwards from the bottom of the first encapsulant layer 2 may account for 55%, 70%, 85% or even 99% of the total amount of the first type phosphor 21, which may cause the first type phosphor 21 to be even more concentrated at the bottom. For example, the first type phosphor 21 in the height range of 20%, 10% or even 5% of the bottom of the first encapsulant layer 2 is 55%, 70%, 85% or even 99% of the total amount of the first type phosphor 21, so that wavelength conversion of most of the light can be completed near the bottom.

It should be noted that, at the bottom of the first encapsulant layer 2, the first type phosphor 21 not only covers the surface of the LED chip 1 so as to conduct wavelength conversion of the light emitted from the LED chip 1, but also covers the portion outside the surface of the LED chip 1. Although the first type phosphor 21 covering the outside of the surface of the LED chip 1 does not play a role in wavelength conversion, the first type phosphor 21 is not completely ineffective. Specifically, the first type phosphor 21 deposited at the bottom of the first encapsulant layer 2 in this embodiment also covers the conductive layer 4, and the first type phosphor 21 forms a thermal shield layer covering the conductive layer 4. Furthermore, a large amount of heat is easily generated during the operation of the LED chip 1. If there is no proper heat dissipation scheme, the accumulation of thermal energy may cause part of the encapsulant to be broken or even burned due to overheating. The first type phosphor 21 of the present embodiment forms a thermal shield layer covering the conductive layer 4, so that the heat of the conductive layer 4 can be uniformly dispersed into the first type phosphor 21, and the thermal energy can be more easily conducted back to the substrate for disposing the LED chip 1 and the conductive layer 4, thus preventing part of the first encapsulant layer 2 from being overheated.

Referring to FIG. 2 again, as described above for the first type phosphor 21, in the present embodiment, most of the second type phosphor 31 is concentrated at the bottom of the second encapsulant layer 3. Specifically, the concentration of the second type phosphor 31 within a height range of 30% from the bottom of the second encapsulant layer 3 accounts for 50% or more of the total amount of the second type phosphor 31. The height proportional relationship of the range can be referred to in the description of the first type phosphor 21, which would not be illustrated in an enlarged view. The advantage of concentrating the second type phosphor 31 at the bottom of the second encapsulant layer 3 is that, either the light that is directly from the LED chip 1 or the light that has been converted by the first type phosphor 21 in the first encapsulant layer 2 will pass through the interface between the first encapsulant layer 2 and the second encapsulant layer 3 to substantially complete the wavelength conversion. In the process of moving up from the bottom of the second encapsulant layer 3, the probability of being absorbed by the second type phosphor 31 is lower and lower, so that the energy is effectively prevented from being gradually consumed in the process of being repeatedly absorbed and released. Accordingly, the present disclosure enables the light passing through the interface between the first encapsulant layer 2 and the second encapsulant layer 3 to perform wavelength conversion efficiently at the aforementioned interface, so as to reduce energy consumption and improve light extraction efficiency. Although the concentration of the second type phosphor 31 in the height range of 30% measured upward from the bottom of the second encapsulant layer 3 is set to 50% or more of the total amount of the second type phosphor 31, in practical applications, the aforementioned height range can be changed to 20%, 10% or even 5% according to the requirements of product performance and cost, and by adjustment of coating methods or deposition conditions; or the aforementioned ratio can be changed to 55%, 70%, 85%, 95% or even 99% or more to ensure that a higher proportion of light can be wavelength converted on the interface between the first encapsulant layer 2 and the second encapsulant layer 3.

[Two Aspects of the Light Spectrum Characteristics of the Second Embodiment]

As described above, the first type phosphor 21 of the present disclosure is excited in the emission peak wavelength in the first wavelength range, the second type phosphor 31 is excited in the emission peak wavelength in the second wavelength range, and the first wavelength range is different from the second wavelength range. Furthermore, the present disclosure does not limit the relationship between the first wavelength range and the second wavelength range. In other words, in practical application, the second embodiment of the present disclosure may include various aspects, and in the following, only two of the embodiments are compared with the related art (the practice of mixing the phosphors of various colors in the encapsulant), in order to explain the technical features of the relative spectral energy distribution curve of the light emitted by the LED package structure Z of the present disclosure. Referring to FIG. 4, where L1 is a relative spectral energy distribution curve of the related art, L2 is a relative spectral energy distribution curve of the first aspect of the second embodiment of the present disclosure, and L3 is a relative spectral energy distribution curve of the second aspect of the second embodiment of the present disclosure.

In the first aspect of the second embodiment of the present disclosure, the first wavelength range corresponding to the first type phosphor 21 is between 600 nm and 660 nm, and the second wavelength range corresponding to the first type phosphor 31 is 500 nm to 575 nm. In other words, in the first encapsulant layer 2 of the first aspect, a mixture of a phosphorescent phosphor that emits a reddish spectrum or a phosphor of other similar properties is mixed, while in the second encapsulant layer 3, a mixture of aluminate phosphors or other similar phosphors capable of emitting a greenish or yellow-green spectrum is used.

In contrast, in the second aspect of the second embodiment of the present disclosure, the first wavelength range corresponding to the first type phosphor 21 is between 500 nm and 575 nm, and the second wavelength range corresponding to the first type phosphor 31 is between 600 nm to 660 nm. In other words, the upper and lower configuration relationship is exactly opposite to the first one. The first encapsulant layer 2 is a mixture of aluminate phosphors or other similar phosphors that emit a greenish or yellowish green spectrum. The second encapsulant layer 3 is a mixture of a nitride phosphor that emits a reddish spectrum or a phosphor of other similar properties.

Next, referring to FIG. 4, the spectral characteristics of the LED package structure Z of the present disclosure will be described below based on the respective curves L1, L2, and L3.

First, a partial parameter excerpt obtained by actually detecting the light emitting efficiency is listed below.

| Related art L1 | |
|---|---|
| WL (nm) | Spectrum (W/nm) |
| 510 | 0.000516 |
| 511 | 0.000522 |
| 532 | 0.000622 (about half of the maximum) |
| 533 | 0.000631 (about half of the maximum) |
| 585 | 0.001035 |
| 586 | 0.001047 |
| 617 | 0.001260 |
| 618 | 0.001263 (maximum) |
| 619 | 0.001262 |
| 678 | 0.000633 (about half of the maximum) |
| 679 | 0.000618 (about half of the maximum) |

The maximum spectral irradiance of the related art occurs at a wavelength of 618 nm, and the maximum spectral irradiance value is about 0.001263 W/nm (i.e., the highest point of the curve L1 in FIG. 4), thereby estimating that half of the maximum spectral irradiance is about 0.000632 W/nm, and the corresponding wavelengths are about 533 nm and 678 nm, respectively. In other words, the spectrum of the light irradiated by the related art has a spectral wavelength in which the spectral radiation intensity is less than 0.5 and a minimum wavelength of less than 535 nm, and the difference between the maximum wavelength (about 680 nm) in which the spectral radiation intensity exceeds 0.5 and the minimum wavelength in which the spectral radiation intensity exceeds 0.5 (as indicated by W1 in FIG. 4) is greater than 140 nm. The significance is that the light emitted by the related art, whose spectral radiance intensity exceeds 0.5, is dispersed in a wide wavelength range, so that the wavelength of the light is not concentrated, and that under the same color rendering conditions, more energy may be required to provide sufficient illumination at the target wavelength.

On the other hand, according to the actual measurement results, the spectrum of the light irradiated by the related art has a spectral irradiance change from 510 nm to 511 nm is 0.000006 nm, and the spectrum of the light irradiated by the related art has a spectral irradiance change from 585 nm to 586 nm is 0.000012 nm. The rate of change is only about 2, which is apparent from the curve L1 that there is no significant change in the slope of this interval. The significance of this is that the light of the different wavelengths of the light emitted by the related art is mixed with a relatively gentle change trend, and there is no tendency to clearly distinguish different colored lights; therefore, it is not easy to achieve excellent performance in color rendering.

Next, a partial parameter excerpt obtained from actual detection of the light emitting efficiency of the first aspect of the second embodiment of the present disclosure is listed below.

| First aspect L2 (red being under green) | |
| --- | --- |
| WL (nm) | Spectrum (W/nm) |
| 511 | 0.000593 |
| 512 | 0.000595 |
| 541 | 0.000686 (about half of the maximum) |
| 585 | 0.001108 |
| 586 | 0.001126 |
| 613 | 0.001370 |
| 614 | 0.001374 (maximum) |
| 615 | 0.001373 |
| 669 | 0.000691 (about half of the maximum) |
| 670 | 0.000676 (about half of the maximum) |

The maximum spectral irradiance of the first aspect occurs at a wavelength of 614 nm, and the maximum spectral irradiance is about 0.001374 W/nm (i.e., the highest point of the curve L2 in FIG. 4), thereby estimating that half of the maximum spectral irradiance is about 0.000687 W/nm, and the corresponding wavelengths are about 541 nm and 669 nm, respectively. In other words, the spectrum of the light irradiated by the first aspect has a spectral wavelength in which the spectral radiation intensity is more than 0.5, and a minimum wavelength of more than 540 nm, and the difference between the maximum wavelength (about 670 nm) in which the spectral radiation intensity exceeds 0.5 and the minimum wavelength in which the spectral radiation intensity exceeds 0.5 (as indicated by W2 in FIG. 4) is greater than 130 nm. The significance is that the light emitted by the first aspect, whose spectral radiance intensity exceeds 0.5, is concentrated in a narrow wavelength range, thus under the same color rendering conditions, better light extraction efficiency can be achieved.

On the other hand, according to the actual measurement results, the spectrum of the light irradiated by the first aspect has a spectral irradiance change from 511 nm to 512 nm is only 0.000002 nm, and the spectral irradiance change from 585 nm to 586 nm reaches 0.000018 nm, and the rate of change reaches 9 times that of. It is also obvious from the curve L2 that the curve in this interval is concave, the slope of the curve near the left side of the interval is relatively gentle, and the slope of the curve near the right side of the interval is steep. The significance of this is that the light of different wavelengths in the first aspect has a more apparent division at the two sides of the interval, so that better color rendering performance can be achieved.

Next, a partial parameter excerpt obtained from actual detection of the light-emitting efficiency of the first aspect of the second embodiment of the present disclosure is listed below.

| Second aspect L3 (green being under red) | |
| --- | --- |
| WL (nm) | Spectrum(W/nm) |
| 545 | 0.000635 (about half of the maximum) |
| 621 | 0.001272 |
| 622 | 0.001275 (maximum) |
| 623 | 0.001273 |
| 679 | 0.000643 (about half of the maximum) |
| 680 | 0.000631 (about half of the maximum) |

The maximum spectral irradiance of the second aspect occurs at a wavelength of 622 nm, and the maximum spectral irradiance is about 0.001275 W/nm (i.e., the highest point of the curve L3 in FIG. 4), thereby estimating that half of the maximum spectral irradiance is about 0.000638 W/nm, and the corresponding wavelengths are about 545 nm and 679 nm, respectively. In other words, the spectrum of the light irradiated by the first aspect has a spectral wavelength in which the spectral radiation intensity is more than 0.5, and a minimum wavelength of more than 545 nm, and the difference between the maximum wavelength (about 680 nm) in which the spectral radiation intensity exceeds 0.5 and the minimum wavelength in which the spectral radiation intensity exceeds 0.5 (as indicated by W3 in FIG. 4) is only 135 nm. The significance of this is that the light emitted by the second aspect whose spectral intensity exceeds 0.5, is concentrated in a narrower wavelength range than the related art, so that under the same color rendering conditions, better light extraction efficiency can be achieved.

Various endeavors with different phosphor configurations and deposition conditions have been undertaken for the sake of verification, from which, under the claimed limitations of the present disclosure, the measurement results indicate that technical features similar to the aforementioned light-emitting characteristics can be achieved. Specifically, in a preferred embodiment of the present disclosure, the relative spectral energy distribution curve of the light emitted by the LED package structure Z, the minimum wavelength of the spectral radiation intensity exceeding 0.5 is greater than 540 nm, and the difference between the maximum wavelength in which the spectral radiation intensity exceeds 0.5 and the minimum wavelength in which the spectral radiation intensity exceeds 0.5 is less than 140 nm. In addition, various embodiments of the present disclosure all show that, in the range of wavelength 510 nm to 585 nm, the slope change rate of the relative spectral energy distribution curve of the light emitted by the LED package structure Z is greater than 4.

In conclusion, one of the beneficial effects of the present disclosure is that, the LED package structure with phosphor encapsulant layer Z provided by the present disclosure has the technical features of "the LED package structure Z includes a first encapsulant layer 2 and a second encapsulant layer 3," and "at least one of the first type phosphor 21 and the second type phosphor 31 is distributed in the corresponding first encapsulant layer 2 or the corresponding second encapsulant layer 3 in a state where the bottom concentration is higher than the top concentration," so as to reduce the loss of energy in the process of repeated absorption and release, thereby improving the light extraction efficiency, increasing the color rendering index, and improving the brightness.

Furthermore, since the light-emitting spectral characteristic of the LED package structure Z of the present disclosure corresponds to the technical feature of "in the relative spectral energy distribution curve of the emitted light, the slope change rate is greater than 4 in the wavelength range of 510 nm to 585 nm," the light of different wavelengths is more clearly divided at the left and right sides of the wavelength range from 510 nm to 585 nm, so that better color rendering performance can be achieved.

On the other hand, since the light-emitting spectral characteristic of the LED package structure Z of the present disclosure correspond to the technical feature of "the minimum wavelength of the spectral radiation intensity exceeding 0.5 is greater than 540 nm" and "the difference between the maximum wavelength in which the spectral radiation intensity exceeds 0.5 and the minimum wavelength in which the spectral radiation intensity exceeds 0.5 is less than 140 nm," the light energy whose spectral radiation intensity exceeds 0.5 is concentrated in a narrow wavelength range of 540 nm or more, so that under the same color rendering conditions, better light extraction efficiency can be achieved.

It is also worth mentioning that the LED package structure with phosphor encapsulant layer Z provided by the present disclosure also has the technical feature of "the first type phosphor 21 depositing at the bottom of the first encapsulant layer 2 to form a thermal shield layer covering the conductive layer 4," so that the heat of the conductive layer 4 is evenly dispersed into the first type phosphor 21, and the thermal energy can be more easily conducted back to the substrate for disposing the LED chip 1 and the conductive layer 4, thus preventing part of the first encapsulant layer 2 from being overheated. Therefore, the risk of the first encapsulant layer 2 being broken or even burned due to overheating can be reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An LED package structure with a phosphor encapsulant layer, comprising:
   an LED chip;
   a first encapsulant layer mixed with a first type phosphor, the first type phosphor being excited to have an emission peak wavelength in a first wavelength range, and the first encapsulant layer covering the LED chip; and
   a second encapsulant layer mixed with a second type phosphor, the second type phosphor being excited to have an emission peak wavelength in a second wavelength range, the second wavelength range being different from the first wavelength range, and the second encapsulant layer covering the first encapsulant layer;
   wherein at least one of the first type phosphor and the second type phosphor is distributed in the corresponding first encapsulant layer or the second encapsulant layer, in a state where a bottom concentration of the at least one of the first type phosphor and the second type phosphor in the corresponding first encapsulant layer or the second encapsulant layer is higher than a top concentration of the at least one of the first type phosphor and the second type phosphor in the corresponding first encapsulant layer or the second encapsulant layer;
   wherein a relative spectral energy distribution curve of a light emitted by the LED package structure has a slope change rate greater than 4 in a wavelength range of 510 nm to 585 nm.

2. The LED package structure with a phosphor encapsulant layer according to claim 1, wherein a concentration of the first type phosphor in the first encapsulant layer decreases from a bottom of the first encapsulant layer to a top of the first encapsulant layer.

3. The LED package structure with a phosphor encapsulant layer according to claim 2, wherein the first type phosphor in a height range of 30% measured upward from the bottom of the first encapsulant layer accounts for more than 50% of a total amount of the first type phosphor.

4. The LED package structure with a phosphor encapsulant layer according to claim 3, wherein the LED package structure further comprises a conductive layer that is electrically connected to the LED chip, and wherein the first type phosphor at the bottom of the first encapsulant layer forms a thermal shield layer covering the conductive layer.

5. The LED package structure with a phosphor encapsulant layer according to claim 2, wherein the LED package structure further comprises a conductive layer that is electrically connected to the LED chip, and wherein the first type phosphor deposited at the bottom of the first encapsulant layer forms a thermal shield layer covering the conductive layer.

6. The LED package structure with a phosphor encapsulant layer according to claim 1, wherein a concentration of the second type phosphor in the second encapsulant layer decreases from a bottom of the second encapsulant layer to a top of the second encapsulant layer.

7. The LED package structure with a phosphor encapsulant layer according to claim 6, wherein the concentration of the second type phosphor in a height range of 30% measured upward from a bottom of the second encapsulant layer accounts for more than 50% of a total amount of the second type phosphor.

8. The LED package structure with a phosphor encapsulant layer according to claim 1, wherein in the relative spectral energy distribution curve of the light emitted by the LED package structure, a minimum wavelength in which a spectral radiance intensity exceeds 0.5 is greater than 540 nm, and a difference between a maximum wavelength in which the spectral radiance intensity exceeds 0.5 and the minimum wavelength in which the spectral radiance intensity exceeds 0.5 is less than 140 nm.

9. The LED package structure with a phosphor encapsulant layer according to claim 1, wherein the first wavelength range is between 600 nm and 660 nm, and the first type phosphor includes one or more phosphor materials having emission peak wavelengths within the first wavelength range.

10. The LED package structure with a phosphor encapsulant layer according to claim 1, wherein the second wavelength range is between 500 nm and 575 nm, and the second type phosphor includes one or more phosphor materials having an emission peak wavelength in the second wavelength range.

11. The LED package structure with a phosphor encapsulant layer according to claim 1, wherein the first wavelength range is between 500 nm and 575 nm, and the first type phosphor includes one or more phosphor materials having emission peak wavelengths within the first wavelength range.

12. The LED package structure with a phosphor encapsulant layer according to claim 1, wherein the second wavelength range is between 600 nm to 660 nm, and the second type phosphor includes one or more phosphor materials having an emission peak wavelength in the second wavelength range.

* * * * *